(12) United States Patent
Kohli et al.

(10) Patent No.: US 9,892,979 B2
(45) Date of Patent: Feb. 13, 2018

(54) NON-DESTRUCTIVE DIELECTRIC LAYER THICKNESS AND DOPANT MEASURING METHOD

(71) Applicant: GLOBALFOUNDRIES INC., Grand Cayman (KY)

(72) Inventors: Kriteshwar K. Kohli, Fishkill, NY (US); Sean M. Polvino, Queens, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 207 days.

(21) Appl. No.: 14/744,198

(22) Filed: Jun. 19, 2015

(65) Prior Publication Data

US 2016/0372385 A1    Dec. 22, 2016

(51) Int. Cl.
| | | |
|---|---|---|
| *H01J 35/00* | (2006.01) | |
| *H01L 21/66* | (2006.01) | |
| *H01L 29/66* | (2006.01) | |
| *H01L 21/84* | (2006.01) | |

(52) U.S. Cl.
CPC ............ *H01L 22/12* (2013.01); *H01L 21/845* (2013.01); *H01L 22/30* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 7,399,963 B2 | 7/2008 | Schueler et al. | |
| 7,411,188 B2 * | 8/2008 | deCecco | .......... H03F 1/26 250/305 |
| 7,420,163 B2 * | 9/2008 | Schueler | .......... G01B 15/02 250/305 |
| 7,714,285 B2 | 5/2010 | Barnard | |
| 7,875,857 B2 * | 1/2011 | Barnard | .......... G01N 23/223 250/396 ML |
| 7,884,321 B2 * | 2/2011 | deCecco | .......... H03F 1/26 250/305 |
| 8,283,732 B2 * | 10/2012 | Sunamura | .......... H01L 21/823835 257/388 |

(Continued)

FOREIGN PATENT DOCUMENTS

| | | | | |
|---|---|---|---|---|
| GB | 2473384 A | * | 3/2011 | ....... H01L 29/66628 |
| GB | 2473384 B | * | 2/2013 | ....... H01L 29/66628 |

(Continued)

OTHER PUBLICATIONS

Thermo Fisher Scientific Inc., ("Characterization of High-k Dielectric Materials on Silicon Using Angle Resolved XPS" 2008, 4 pages.*

(Continued)

*Primary Examiner* — Andrew Smyth
(74) *Attorney, Agent, or Firm* — Michael LeStrange; Hoffman Warnick LLC

(57) ABSTRACT

A semiconductor device or article includes a substrate including a feature and divided into a feature region in which the feature is formed and a pad region in which the substrate is substantially unmodified, and a layer of interest applied over the substrate and feature. The pad and feature regions are irradiated and resulting photoelectron intensities are recorded and used to determine a thickness of the layer of interest over the feature. In addition, if the layer of interest includes an atomic species distinct from any in the substrate, an actual dose of the atomic species can be determined.

20 Claims, 9 Drawing Sheets

(56) References Cited

U.S. PATENT DOCUMENTS

| | | | |
|---|---|---|---|
| 8,735,252 B2 | 5/2014 | Yu et al. | |
| 2006/0165912 A1* | 7/2006 | Koberstein | B29C 59/16 427/532 |
| 2006/0243904 A1* | 11/2006 | Schueler | G01B 15/02 250/305 |
| 2007/0010973 A1* | 1/2007 | deCecco | H03F 1/26 702/189 |
| 2007/0134420 A1* | 6/2007 | Koberstein | A61L 27/34 427/258 |
| 2011/0210246 A1* | 9/2011 | Cohen | G01N 23/2273 250/305 |
| 2013/0029494 A1 | 1/2013 | Sasaki et al. | |
| 2013/0330906 A1 | 12/2013 | Yu et al. | |

FOREIGN PATENT DOCUMENTS

| | | | |
|---|---|---|---|
| JP | 11118035 A * | 4/1999 | |
| JP | 2009191615 A | 8/2009 | |
| JP | 2010118643 A | 5/2010 | |
| JP | 2011044576 A | 3/2011 | |

OTHER PUBLICATIONS

Thermo Fisher Scientific Inc., "Characterization of High-k Dielectric Materials on Silicon Using Angle Resolved XPS," 2008, 4 pages.

Thermo Fisher Scientific Inc., "Characterization of Silicon Oxide and Oxynitride Layers," 2008, 4 pages.

\* cited by examiner

NON-DESTRUCTIVE DIELECTRIC LAYER THICKNESS AND DOPANT MEASURING METHOD

BACKGROUND

The invention relates generally to semiconductor structures and fabrication of semiconductor chips and, in particular, to methods of measuring thickness and dopant content of a layer of interest applied over a feature, particularly for layers of material including an atomic species distinct from that/those of the underlying layer(s), and more particularly for measuring dopant dosage in doped dielectric layers applied to devices and/or structures in the underlying layer(s), such as fins of finFETs, and apparatus therefor.

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components.

When features are coated with additional layers of material, it can become difficult to check them for suitable layer thickness and content. For example, one type of feature becoming more common in ICs is a so-called finFET—a field effect transistor with a vertical orientation that resembles a fin. Such finFETs can be formed in a number of ways and on a number of substrates, such as on silicon on insulator (SOI) wafers, bulk silicon (Si) wafers, and/or other substrates as may be appropriate and/or desired. When using SOI wafers that include a semiconductor substrate such as Si, a dielectric layer atop the semiconductor substrate often referred to as a BOX layer, and a layer of semiconductor atop the BOX layer, which can include monocrystalline silicon, known processes are used to form grooves in the silicon over the BOX layer to define the bases of fins and deposit dielectric over the whole article so that a layer of the dielectric material forms on the fin bases and other areas, such as a blanket pad region. Similarly, when using bulk Si substrate, known processes, such as etching, are used to form fins by forming grooves, the fins then being isolated using shallow trench isolation (STI), which includes depositing a dielectric material in trenches around the fins to isolate them. Some fabrication processes also dope a gate dielectric layer with a dopant, such as nitrogen (N), to enhance performance of the finFETs or otherwise alter their properties and/or behavior during operation. However, because of the topography of the finFETs, checking layer thickness and dopant concentration can be problematic.

SUMMARY

An embodiment of the invention disclosed herein may include a computer program product including program instructions stored on a computer readable storage medium, wherein the computer readable storage medium is not a transitory signal per se, the program instructions executable by a computing device in communication with an X-ray photoelectron spectroscopy (XPS) apparatus. When executed by a computing device, the program instructions can cause the computing device to perform a method of irradiating with the XPS apparatus a pad region of a semiconductor device and a feature region of the semiconductor device, the feature region including a feature of the semiconductor device, both the pad region and the feature region including a layer of interest applied to a substrate of the semiconductor device. In addition, the method can include recording with the XPS apparatus a pad response to radiation interacting with the pad region of the semiconductor device, and recording with the XPS apparatus a feature response to radiation interacting with the feature region of the semiconductor device. The method can include determining a characteristic of the layer of interest in the feature region based on a relationship between the pad response and the feature response.

Another embodiment of the invention disclosed herein may include a process including forming a feature in a semiconductor substrate, thereby forming a feature region including the feature and a pad region including substantially unmodified substrate material and applying a material layer of interest over the feature and the pad region. In addition, the process can include irradiating the pad region with X-rays and recording resulting photoelectron intensities and respective locations thereof from the pad region, irradiating the feature region with X-rays and recording resulting photoelectron intensities and respective locations thereof from the feature region, and identifying peak photoelectron intensities from each of the pad region and the feature region. Further, the process can include determining respective photoelectron species for each peak intensity based at least in part on a location of the respective peak with respect to the feature region, and determining a characteristic of the layer of interest based at least in part on a relationship between at least two of the photoelectron intensity peaks.

A further embodiment of the invention disclosed herein may include a system comprising at least one computing device in communication with an X-ray photoelectron spectroscopy (XPS) apparatus including a target stage and an X-ray beam generator, the at least one computing device including at least one non-transitory computer readable storage medium on which is stored instructions in the form of computer executable code. When executed by the at least one computing device, the computer executable code can cause the at least one computing device to instruct the XPS apparatus to irradiate a semiconductor device including a substrate layer and a layer of interest over a pad region and a feature region, the feature region including at least one feature of the semiconductor device. In addition, the computing device can instruct the XPS apparatus to record intensities of photoelectrons emitted from the pad region and respective locations from which the photoelectrons are emitted, and to instruct the XPS apparatus to record intensities of photoelectrons emitted from the feature region and respective locations from which the photoelectrons are emitted. In addition, the computer executable code can cause the computing device to identify peak photoelectron intensities and respective locations from which the peak photoelectron intensities were emitted, and to determine a thickness $T_F$ of the layer of interest over the feature based at least in part on the relationship:

$$T_F = L * \ln\left[k_{Di}\left(\frac{I_{DiF}}{I_{SubPad}}\right) + 1 - k_{Di} \cdot P\right],$$

where L is the EAL for the layer of interest, $k_{Di}$ is a constant representing photoelectron intensities that would result from irradiating substrate and layer of interest of infinite thickness, $I_{DiF}$ is a measured feature intensity of photoelectrons emitted by the layer of interest over the feature, $I_{SubPad}$ is a measured pad intensity of photoelectrons emitted by the substrate in the pad region, and P is a plasmon correction constant.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings.

DETAILED DESCRIPTION

Figure 1:
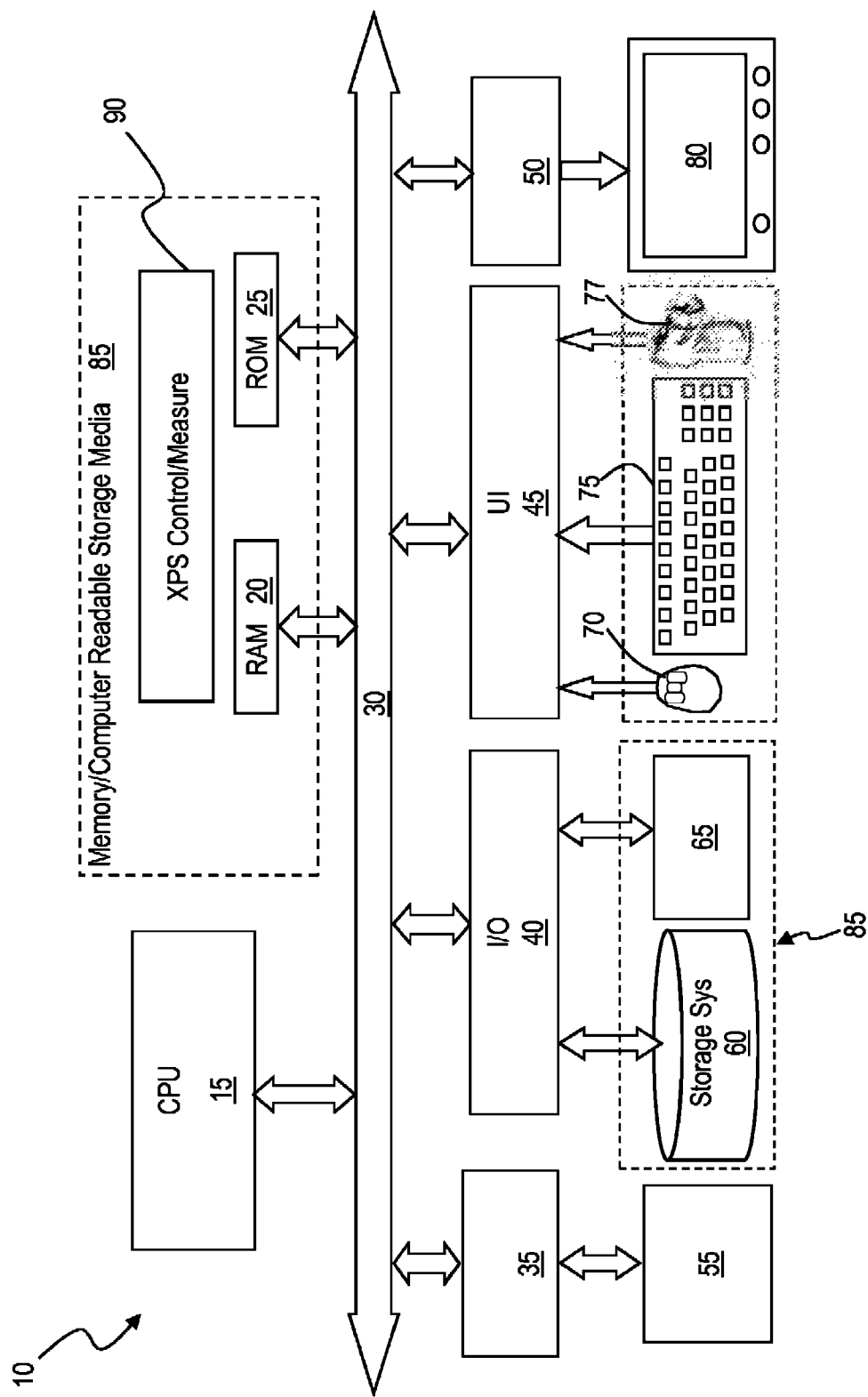
FIG. 1 is a schematic block diagram of a computing environment with which embodiments of the invention disclosed herein can be implemented.

Embodiments of the present invention are directed to a technique that can be used to determine characteristics of layers of semiconductor devices, such as thickness and dopant dose, particularly in patterned regions of a semiconductor device. Typical techniques include DF-STEM and SIMS, but these are offline characterization techniques that can be destructive, slow, and produce unacceptable error when applied to patterned regions of a semiconductor device. X-ray photoelectron spectroscopy (XPS), is a nondestructive characterization technique based on the photoelectric effect in which atoms bombarded with X-rays absorb energy that places the atoms' electrons in unstable states. The energy is then released by the emission of electrons, dubbed "photoelectrons" in this context, each element emitting photoelectrons of specific energies or other characteristics that enable the identification of an atom based on observed emitted photoelectrons. XPS can be used, for example, to determine a number of characteristics of thin films and/or layers of material of a wafer, including surface analyses, chemical states, elemental/material distributions, impurity analyses, dopant doses, doses of other materials and/or compounds and/or atomic species, thicknesses, and uniformities. However, XPS suffers from the same disadvantages as other techniques in that it produces unacceptable error when applied to patterned regions. Embodiments of the invention disclosed herein provide a method to apply XPS to patterned regions, as well as a method to incorporate a new application of XPS into a fabrication line, thus enhancing quality of workpiece, effective yield, and efficiency while avoiding destruction of workpiece in obtaining desired information.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 shows an example of a block diagram of a general-purpose computer system 10 which can be used to implement the method, system, computer program, and/or computer program product described herein. The method, system, computer program, and/or computer program product may be coded as a set of instructions on removable or hard media for use by general-purpose computer, and thus may, in embodiments, include a computer program product. FIG. 1 is also a schematic block diagram of a general-purpose computer for practicing the present invention. Computer system 10 can have at least one microprocessor or central processing unit (CPU) 15. CPU 15 can be interconnected via a system bus 30 to machine readable media 85, which can include, for example, a random access memory (RAM) 20, a read-only memory (ROM) 25, a removable and/or program storage device 65, and/or a mass data and/or program storage device 60. An input/output (I/O) adapter 40 can connect mass storage device 60 and removable storage device 65 to system bus 30. A user interface 45 can connect a keyboard 75 and/or a mouse 70 and/or an image capture device 77, such as a camera, and/or any other suitable input device to system bus 30, and a port adapter 35 can connect a data port 55 to system bus 30 and a display adapter 50 can connect a display device 80. ROM 25 can include the basic operating system for computer system 10. Examples of removable data and/or program storage device 65 include magnetic media such as floppy drives, tape drives, portable flash drives, zip drives, and optical media such as CD ROM or DVD drives. Examples of mass data and/or program storage device 60 include hard disk drives and non-volatile memory such as flash memory. In addition to keyboard 75 and mouse 70, other user input devices such as trackballs, writing tablets, pressure pads, microphones, light pens and position-sensing screen displays may be connected to user interface 45. Examples of display device 80 include cathode-ray tubes (CRT), liquid crystal diode (LCD) displays, light emitting diode (LED) displays, plasma displays, holographic displays, tactile displays, and/or any other display device as may be available, suitable, and/or known now and/or in the future.

A machine readable computer program may be created by one of skill in the art and stored in computer system 10 or a data and/or any one or more of machine readable medium 85, such as in the form of a computer program product 90, to simplify the practicing of this invention. In operation, information for the computer program created to run the present invention can be loaded on the appropriate removable data and/or program storage device 65, fed through data port 55, acquired with image capture device 77, and/or entered using keyboard 75. A user can control the program by manipulating functions performed by the computer program and providing other data inputs via any of the above mentioned data input means. Display device 80 can provide a means for the user to accurately control the computer program and perform the desired tasks described herein.

Computer program product 90 according to embodiments of the invention disclosed herein can be stored in memory and/or computer readable storage media 85, in embodiments. While shown as outside of RAM 20 and ROM 25, it should be readily apparent that computer program product

90 and/or portions thereof can reside in these and/or any other storage medium accessible by computer system 10. It should be noted that CPU(s) 15 can in embodiments be called a computing device(s), but that computer system 10 as a whole, or portions thereof, could also be called a computing device.

Broadly, embodiments employ XPS to measure two regions of a semiconductor device and use the measurements to determine properties of a layer or region of interest that includes an atomic species, elemental or as part of a compound, that is distinct from any in an underlying layer and/or that emits a photoelectron species distinct from any emitted by an underlying layer. In particular applications of XPS according to embodiments, a reference region and a region of interest can be irradiated or bombarded with X-rays, which results in the irradiated regions emitting photoelectrons of various species at various intensities depending on the materials irradiated, their thicknesses, the presence of dopants or other impurities, and other factors. By measuring intensities of photoelectrons emitted by the reference region and region of interest responsive to irradiation, particularly including measuring the intensities of photoelectrons emitted by the atomic species that emits at least one photoelectron species distinct from any emitted by an underlying layer whose photoelectron intensities are also measured in the process, the measured intensities can be used to determine characteristics of layers of interest.

A technique using XPS to determine material properties of a layer of interest in a blanket or substantially uniform region of a wafer is described in U.S. Pat. Nos. 7,420,163 and 7,884,321 assigned to ReVera Incorporated, the disclosures of which are incorporated by reference. These patents describe a basic relationship for determining thickness t of a layer of material on a substrate using XPS. For a case in which electron attenuation length (EAL) of both materials is substantially identical, the relationship can be simplified as:

$$t = \lambda_{1,Film} * \ln\left(k\left(\frac{I_1}{I_0}\right) + 1\right), \quad (1)$$

where $\lambda_{1,Film}$ is the EAL for the layer of material or layer of interest, $$k = \left(\frac{I_{0,\infty}}{I_{1,\infty}}\right)$$

is the ratio of photoelectron intensities that would result from irradiating the substrate and layer of material of infinite thickness, $I_1$ is a measured intensity of photoelectrons emitted by the layer of interest, and $I_0$ is a measured intensity of photoelectrons emitted by the substrate. However, some assumptions are made regarding the substrate and film that simply do not hold up when variations in wafer topography occur. For example, when this relationship is applied to determine the thickness of a dielectric layer applied to the fin of a finFET, errors of 40% or more can result, even as much as 100% where fin thickness is reported as nearly double pad thickness.

To enable the use of XPS to determine characteristics of thin films or layers of materials in patterned regions or portions of semiconductor devices or wafers, embodiments of the invention disclosed herein take advantage of certain findings to take more complex topographies into account. Embodiments can advantageously be employed inline, enabling quality control of layers of interest without requiring removal of the workpiece from the fabrication process, instead incorporating an XPS system and/or method according to embodiments into the fabrication line.

Embodiments of the invention disclosed herein are described using the example of a layer of silicon oxynitride applied over blanket and patterned regions of a silicon on insulator (SOI) wafer, the patterned region including at least one fin of a finFET. It should be recognized, however, that this is by example only and is in no way meant to limit embodiments of the invention, which can be used with a vast array of combinations of layers of interest applied over other types of features, structures, and/or devices formed or otherwise appearing in any suitable underlying layer.

Figure 2:
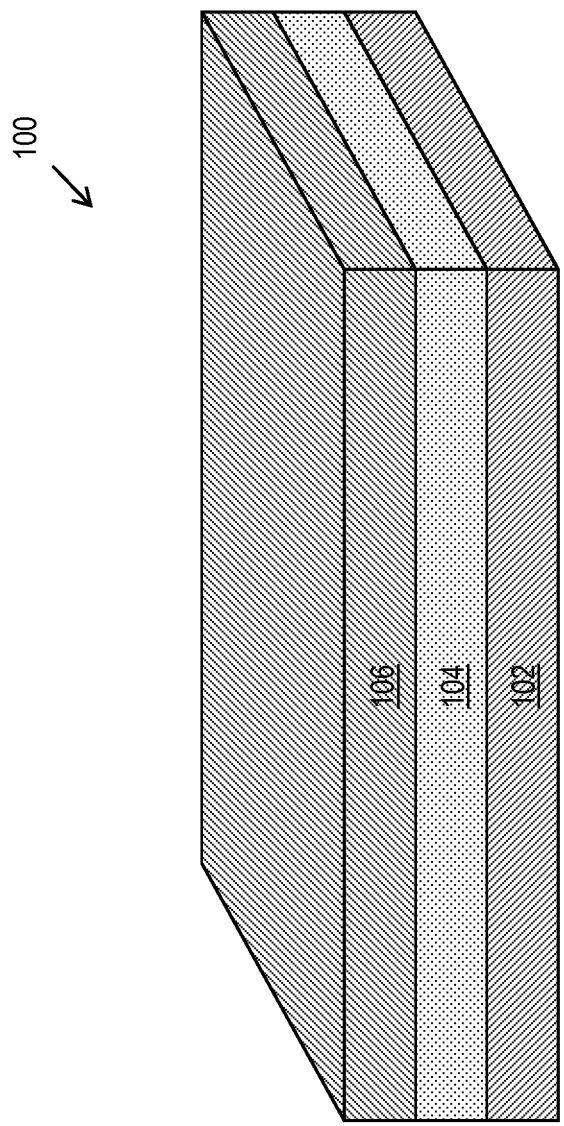
FIG. 2 is a schematic illustration of a substrate, here a non-limiting example of a silicon on insulator (SOI) substrate wafer, that can be employed with embodiments of the invention disclosed herein.

A typical silicon on insulator (SOI) 100 wafer is shown in FIG. 2 and includes a substrate layer 102, an insulator layer (such as a BOX layer) 104, and a semiconductor (SOI) layer 106. SOI technology typically refers to the use of a layered silicon-insulator-silicon substrate in place of a more conventional silicon (Si) substrate (Bulk Substrate) in semiconductor manufacturing, especially microelectronics. SOI-based devices differ from conventional silicon-built devices in that the silicon junction is above an electrical insulator, typically an oxide of silicon, such as silicon dioxide ($SiO_2$) or, less commonly, sapphire. The choice of insulator depends largely on intended application, with sapphire being used for radiation-sensitive applications and silicon oxide preferred for improved performance and diminished short channel effects in microelectronics devices. The precise thickness of the insulating layer and topmost silicon layer also vary widely with the intended application.

While wafer 100 is shown and/or described as a typical SOI wafer, substrate layer 102, insulator layer 104, and semiconductor layer 106 can include other materials. For example, substrate layer 102 could include, but is not limited to, silicon, germanium, silicon germanium, silicon carbide, and combinations consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrate materials include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, SOI layer 106 and/or another layer may be strained.

Grooves 108 can be formed in SOI layer 106 (FIG. 3) to define features, such as fins 110 for finFETs that will become finFET sources and drains, in a feature region 112 of wafer 100. As shown in FIG. 4, a dielectric material can be deposited over wafer 100 to form a dielectric layer 114 over a blanket pad region 116 of wafer 100 and gate dielectric caps 118 atop fins 110. In some processes, doping of the applied dielectric material can be performed to alter the properties of gate dielectric caps 118 and the finFET they will be used to form. For example, where dielectric layer 114 and dielectric caps are initially SiO, they can be transformed into silicon oxynitride (SiON) by doping dielectric layer 114 and dielectric caps 118 with nitrogen (N), such as by plasma chemical vapor deposition (PCVD), by heating overlain layers of silicon nitride and silicon dioxide, or other known techniques. In other embodiments, dielectric layer 114 can include SiON deposited as a layer by any suitable method. Before completing finFET fabrication by patterning and removing excess dielectric material from gate dielectric caps 118, it is desirable to check the cap thickness and content. This can be particularly important when using SiON because nitrogen dose drift is a known reliability detractor. The particular method by which SiON is formed is not particularly relevant to embodiments of the invention disclosed herein since embodiments are directed to assessing the N content of the SiON layer.

Dose of dopant is typically expressed as a number of atoms of dopant per unit area of doped material. However, this can also be expressed as a thickness of the doped material times the number of atoms of dopant per unit volume of doped material. In the case of SiON, this relationship suggests that dose of dopant in the material $\text{Dose}_{N\text{-}SiON}$ is proportional to the thickness of the material $t_{SiON}$ times the intensity of 1s photoelectrons emitted by nitrogen atoms in the material $I_{N1s_{SiON}}$ over the intensity of 2p photoelectrons emitted by Si in the material when irradiated with X-rays $I_{Si2p_{SiON}}$, or:

$$\text{Dose}_{N-SiON} \propto t_{SiON}\left(\frac{I_{N1s_{SiON}}}{I_{Si2p_{SiON}}}\right). \quad (2)$$

Figure 3:
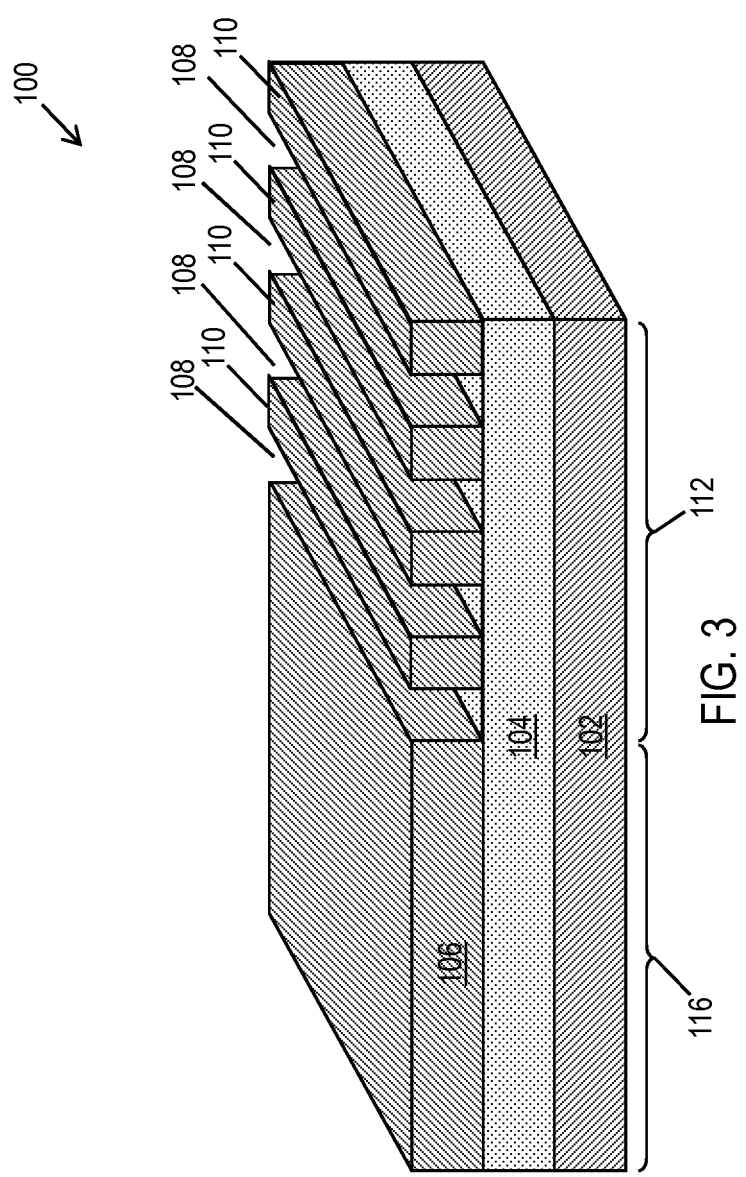
FIG. 3 is a schematic illustration of the wafer of FIG. 2 with grooves formed therein according to embodiments of the invention disclosed herein.
Figure 4:
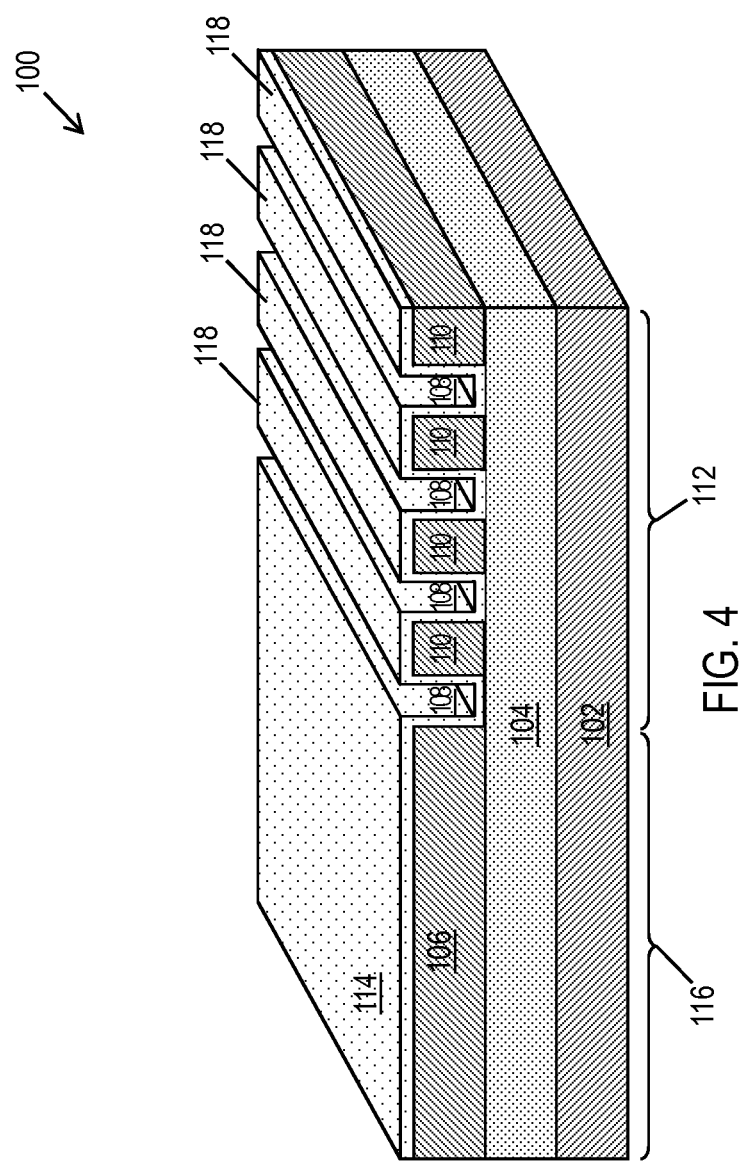
FIG. 4 is a schematic illustration of the wafer of FIGS. 2 and 3 after a layer of interest has been deposited according to embodiments of the invention disclosed herein.

To pursue embodiments of the invention, a SOI wafer was prepared as illustrated in FIGS. 1-3, the substrate layer 102 including pSi, the BOX layer 104 including silicon dioxide (SiO$_2$), the SOI layer 106 including Si, the dielectric material including SiO, and the dopant including N. Thus, dielectric layer 114 and dielectric caps 118 included SiON. XPS was then conducted on the prepared wafer.

Figure 5:
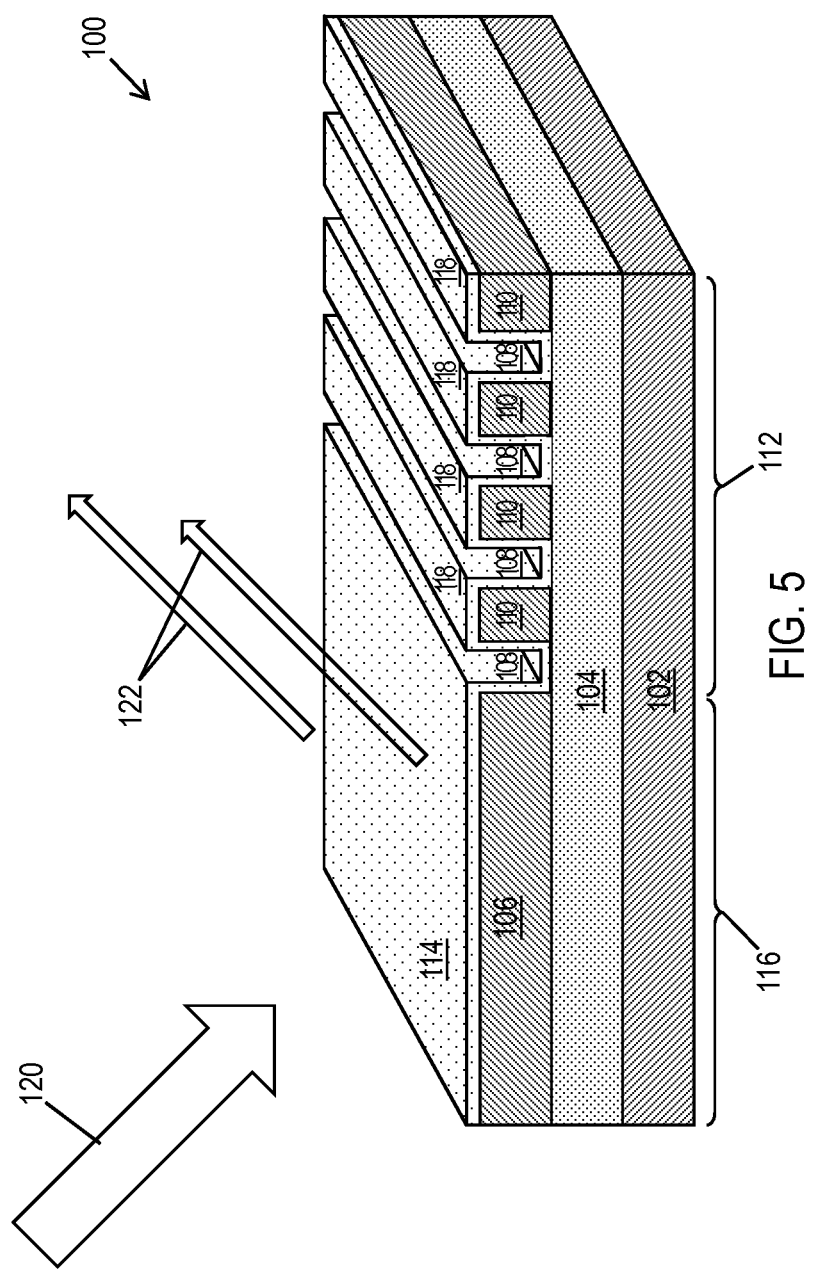
FIG. 5 is a schematic illustration of the wafer of FIG. 4 with a pad region thereof being irradiated according to embodiments of the invention disclosed herein.
Figure 6:
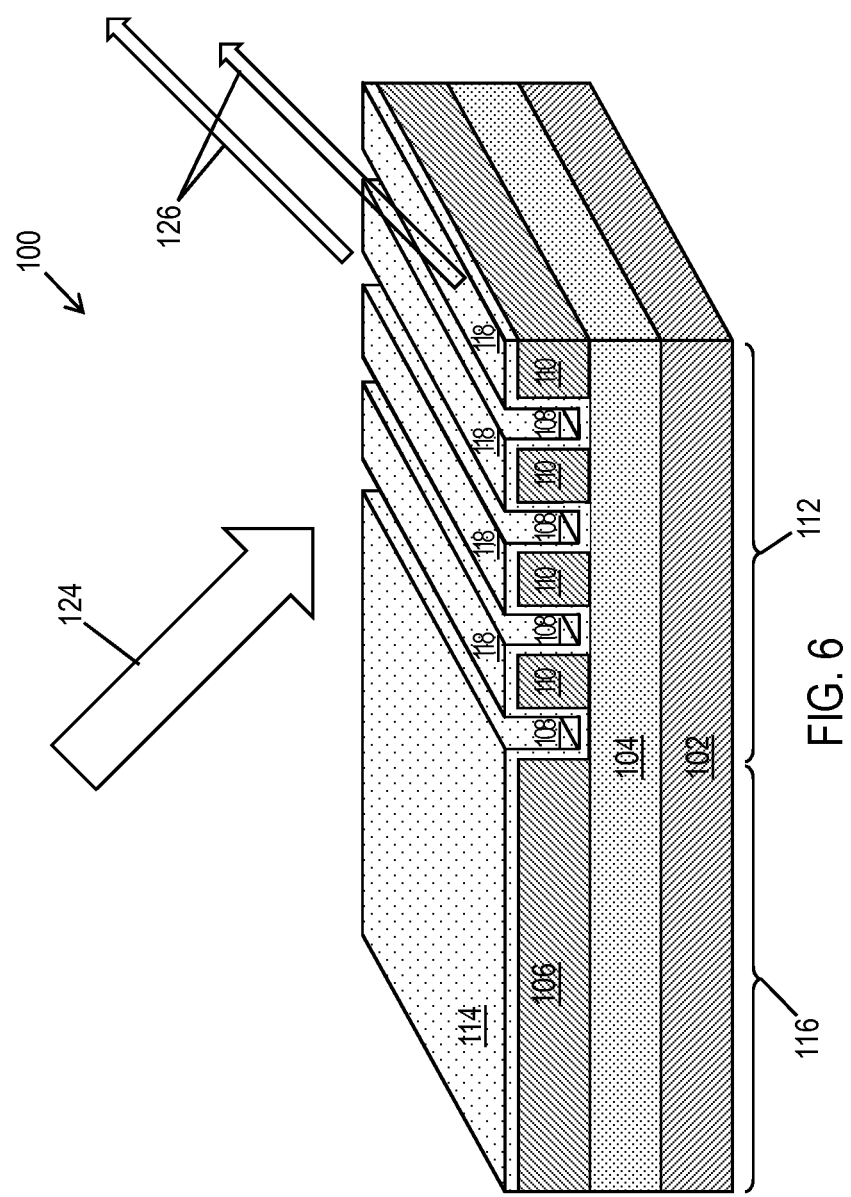
FIG. 6 is a schematic illustration of the wafer of FIGS. 4 and 5 with a feature region thereof being irradiated according to embodiments of the invention disclosed herein.

As illustrated in FIG. 5, blanket pad region 116 was irradiated with X-rays 120 and intensities of blanket pad photoelectrons 122 emitted by materials in blanket pad region 116 responsive to the irradiation were measured. Then, as illustrated in FIG. 6, feature region 112 was irradiated with X-rays 124 and intensities of feature region photoelectrons 126 emitted by materials in feature region 112 responsive to the irradiation were measured. While feature region 112 was bombarded or irradiated after blanket pad region 116, the order in which the two regions are irradiated is not important so long as both are irradiated with radiation of the same intensity, wavelength, and angle of incidence.

Figure 7:
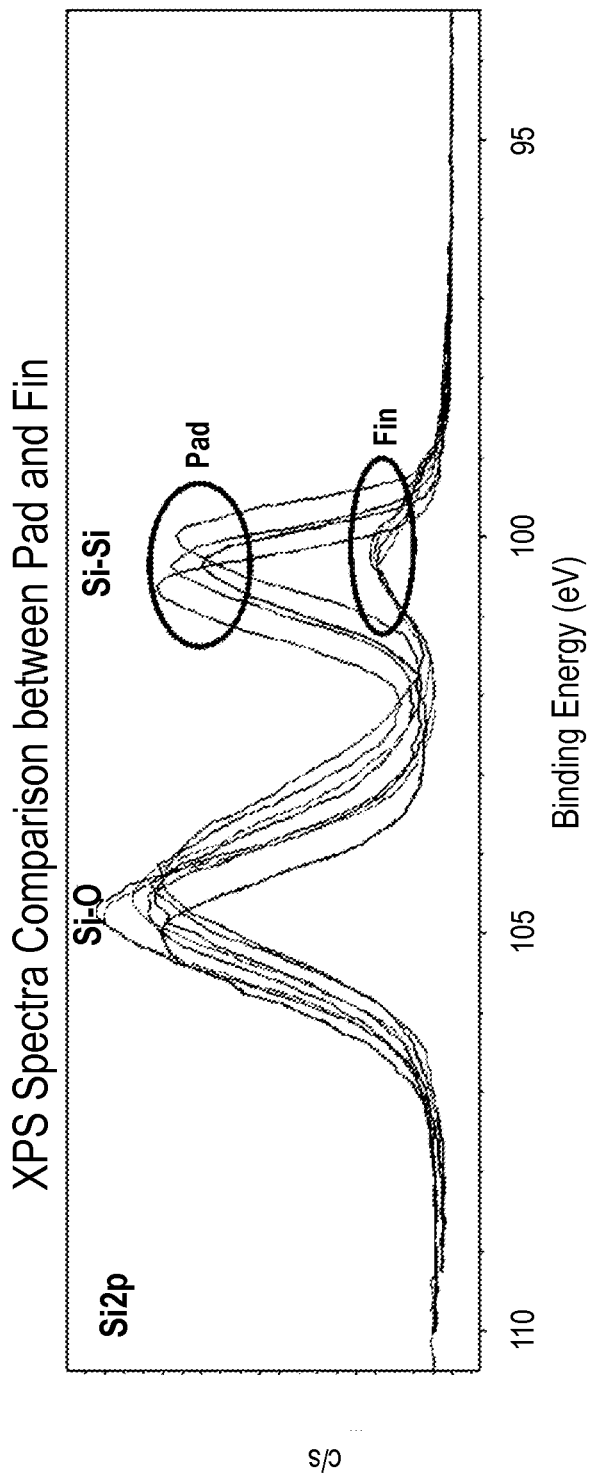
FIG. 7 is a schematic illustration of photoelectron intensity from the layer of interest and the substrate according to an embodiment of the invention disclosed herein.

An example of measured photoelectron intensities resulting from such X-ray bombardment or irradiation is shown in FIG. 7, which is a graph showing intensity of Si2p photoelectrons versus binding energy. Binding energy of a photoelectron indicates what material and which electron shell emitted the photoelectron. When analyzing the recorded or measured photoelectron intensities, it was noted that the peak intensity of photoelectrons emitted by Si in feature region 112 was significantly lower than the peak intensity of the same species of photoelectrons emitted by Si in blanket pad region 116, most likely as a result of silicon being removed from SOI layer 106 during formation of grooves 108. However, the intensity of photoelectrons emitted by SiO was largely unchanged as between blanket pad region 116 and feature region 112 despite the change in surface area. This lack of geometric effect on SiO photoelectron intensity enables the use of blanket pad region 116 as a reference to normalize intensity of photoelectrons emitted by Si in the SiO layer. Using blanket pad region 116 as a reference in turn enables modification of the typical XPS relationship to determine thickness of SiO(N) gate dielectric caps 118 over fins 110 in feature region 112. The EALs of SiO and SiON are substantially equal, and the ratio of intensities of Si and SiON layers of infinite thickness is substantially equal to that of the ratio between Si and SiO, but additional error is introduced by plasmon effects. Plasmon correction is recognized in the art and is needed to account for the alteration of the behavior of incident X-rays and/or emitted photoelectrons by plasmons at the barrier between the semiconductor and insulator layers of wafer 100 and/or at/on surfaces of the semiconductor layers. For the particular case of a layer of SiON on fins formed in an SOI wafer, a plasmon correction P of −0.01075 was used, though different values may be required for different materials and/or topographies as is known in the art.

As is known, plasmons describe the behavior and energy of electrons in a material, especially in metallic materials, elements, and/or compounds that have a significant number of free electrons by quantifying the oscillation of the free electrons. Each plasmon represents a quantum of oscillation, since electrons are quantum particles, and since everything can be expressed or described as vibrations or oscillations at the quantum level, plasmons act as particles even though they simply quantify the oscillation of electrons in a material. Because they quantify oscillation but act as particles, plasmons are referred to as quasiparticles. Plasmons are responsible for many phenomena observed by everyone every day, including mirror reflections and shiny metal surfaces, and have even been applied in very small scale photolithography and in optoelectronics with excellent results.

It was thus found that, with appropriate correction for known physical phenomena, the Si—Si photoelectron intensity from blanket pad region 116 can be used as a reference in determining characteristics of layer of interest 114 in feature region 112, such as characteristics of caps 118. As a result, it was found that the thickness of a layer of interest $T_F$, such as a dielectric layer, over a feature in a patterned region of an underlying layer, such as of a semiconductor device, can be determined using the relationship:

$$T_F = L*\ln\left[k_{Di}\left(\frac{I_{DiF}}{I_{SubPad}}\right) + 1 - k_{Di} \cdot P\right], \quad (4)$$

where L is the EAL for the dielectric layer, $k_{Di}$ is a constant representing photoelectron intensities that would result from irradiating an underlying layer and layer of interest of infinite thickness, $I_{DiF}$ is a measured feature intensity of photoelectrons emitted by the layer of interest over the feature, $I_{SubPad}$ is a measured pad intensity of photoelectrons emitted by the underlying layer in the reference or pad region, and P is a plasmon correction constant. For the particular case shown in the FIGS., the thickness of SiON over a fin $T_{Fin}$ can be determined using the relationship:

$$T_{Fin} = L*\ln\left[k_{SiO}\left(\frac{I_{SiOFin}}{I_{SiPad}}\right) + 1 - k_{SiO} \cdot P\right], \quad (3)$$

where L is the EAL for SiO (and SiON), $k_{SiO}$ is a constant representing photoelectron intensities that would result from irradiating substrate and dielectric layers of infinite thickness, $I_{SiOFin}$ is a measured feature intensity of photoelectrons emitted by Si in SiO and SiON over the fin, $I_{SiPad}$ is a measured pad intensity of photoelectrons emitted by Si in the substrate in the blanket pad region, and P is the plasmon correction constant for the particular materials and/or topography.

Figure 8:
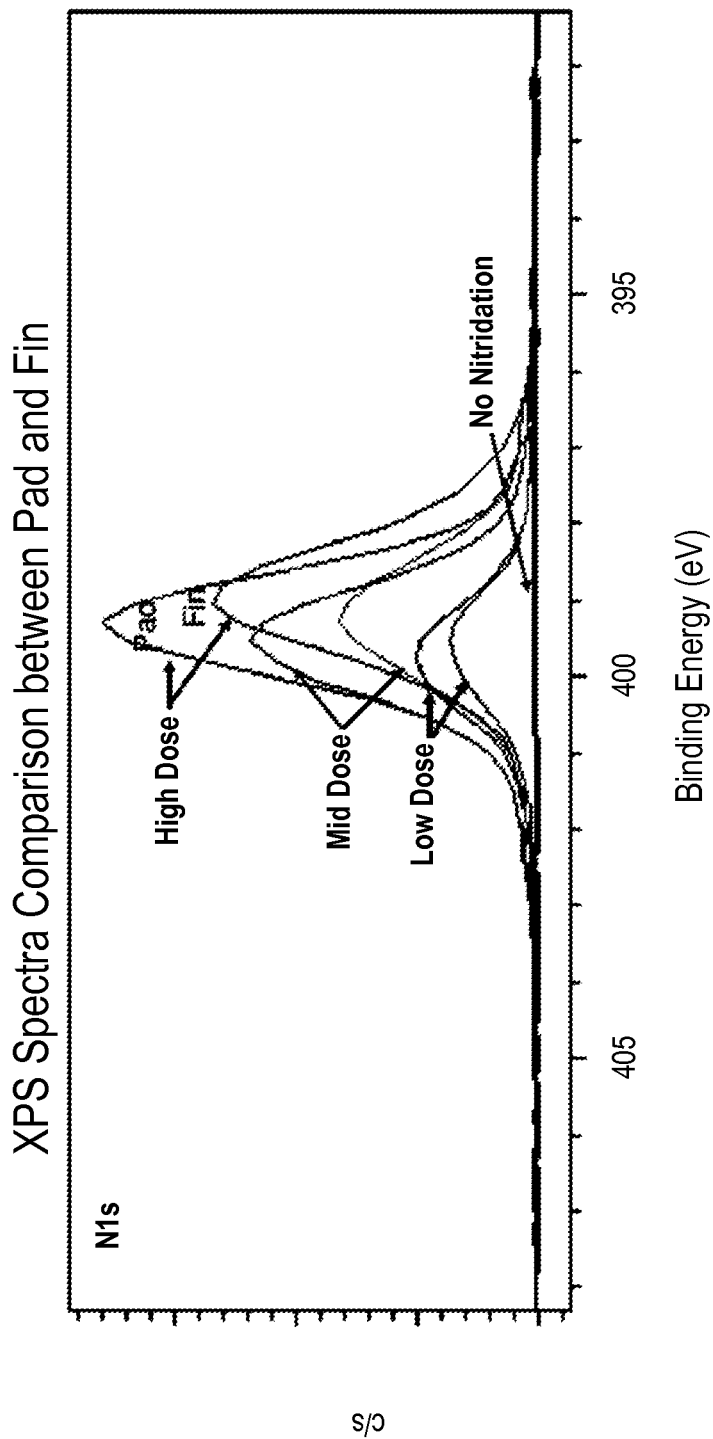
FIG. 8 is a schematic illustration of photoelectron intensity from an atomic species, such as a dopant, in a layer of interest according to embodiments of the invention disclosed herein.

These findings can be carried through to dose determination, the standard dose relationship being:

$$\text{Dose}_{Dop} = \rho_{doped\ mat'l\ component} * T_{doped\ mat'l} * \left(\frac{I_{Dop\ pe\ species_{doped\ mat'l}}}{I_{doped\ mat'l\ pe\ species_{doped\ mat'l}}}\right) * \left(\frac{R_{doped\ mat'l}}{R_{Dop}}\right) \quad (5)$$

where $\rho_{doped\ material\ component}$ is the atomic density of a component or atomic species of the doped material, doped material here being used in a broader sense that can include any material having an atomic species that is distinct from another material being used for comparison, $T_{doped\ material}$ is the thickness of the doped material, I is photoelectron species intensity, and R is a relative sensitivity factor for a material. Surprisingly, as illustrated for the specific case of N in SiO to form SiON in FIG. 8, peak 1s photoelectron intensity for N was lower in feature region 112 than in blanket pad region 116 even though peak Si—O—Si2p photoelectron intensity was substantially identical in the two regions. If geometry were a factor, then a change in SiO-Si2p photoelectron intensity should have been observed. Since there was no such change, it was concluded that geometry was not a factor in photoelectron intensity, and that the difference in N1s intensity can be attributed to the quantity of N present with negligible geometrical effects. The standard dose relationship can therefore be used unmodified so long as thickness is determined in accordance with embodiments of the invention disclosed herein. Since N1s photoelectron intensity can be an indicator of N dose in SiO on the fins, the relationship becomes:

$$\text{Dose}_{NFin} = \rho_{Si} * T_{Fin} * \left(\frac{I_{NFin}}{I_{SiOPad}}\right) * \left(\frac{R_{SiO}}{R_N}\right) \quad (6)$$

where $R_{SiO}=R_{N1s}=3.4$, $R_N=R_{Si2p}=3.0$, and $\rho_{Si}=2.2050\cdot10^5$.

More broadly, the dose $\text{Dose}_F$ of an atomic species in the layer of interest over the feature in the feature region, the atomic species being distinct from any in the underlying layer or substrate, can be found using the relationship:

$$\text{Dose}_F = \rho_{Sub} * T_F * \left(\frac{I_{DopF}}{I_{DiPad}}\right) * \left(\frac{R_{Di}}{R_{Dop}}\right) \quad (7)$$

where $\rho_{sub}$ is the density of the substrate material, $T_F$ is the thickness of the layer of interest over the feature, $I_{DopF}$ is photoelectron intensity of the atomic species over the feature, $I_{DiPad}$ is photoelectron intensity of the layer of interest in the blanket pad region, and R is relative sensitivity factor.

Figure 9:
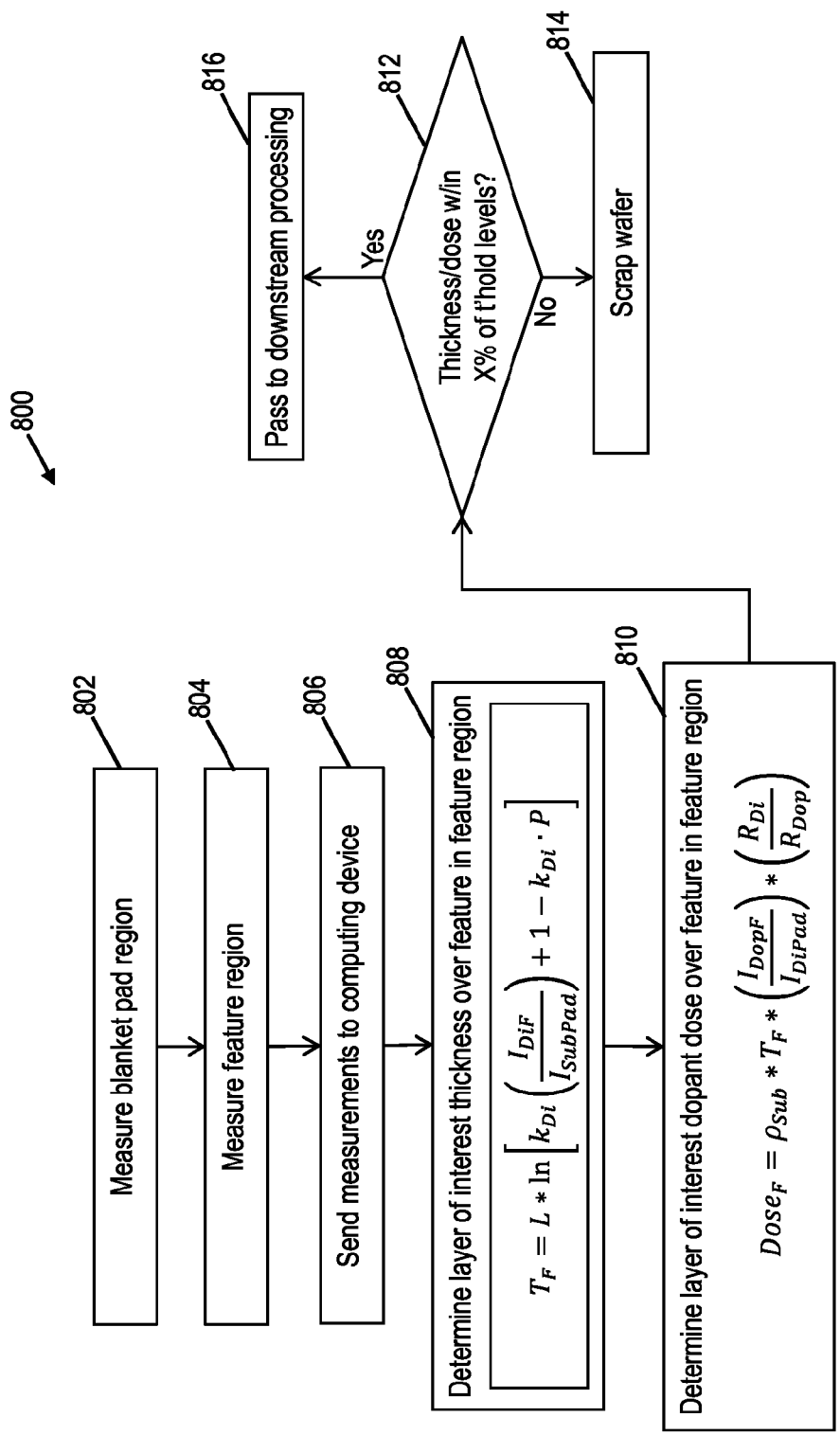
FIG. 9 is a schematic flow diagram of a method according to embodiments of the invention disclosed herein.

FIG. 9 shows a method 800 implementing embodiments of the invention disclosed herein as part of a quality assessment of a coated, patterned wafer. More specifically, a blanket pad region of the wafer is measured (block 802), and a feature region of the wafer is measured (block 804), such as with X-ray photoelectron spectroscopy as described above. Recorded or measured intensities are sent to a computing device (block 806) and are used to determine a thickness of a layer of interest over a feature in the feature region (block 808) as well as to determine a dopant dose in the layer of interest over the feature in the feature region (block 810). In embodiments, thickness can be determined using, for example, relationship (3) and/or relationship (4), and dose can be determined using, for example, relationship (5), relationship (6), and/or relationship (7). The thickness and dose are compared to respective threshold levels (block 812) and if either the thickness or the dose is not within a predefined percentage of a desired or threshold level, the wafer is scrapped (block 814) and the method ends or proceeds to a new wafer. Being within a predefined percentage of a desired or threshold level can also be said to be within a particular amount of error or variance determined as a percentage difference from the desired or threshold level. In embodiments, for example, an error or variance of 20%, that is, the determined dose being within 20% of the threshold level, can be used, though other error or variance values can be used as may be suitable and/or desired. If both the thickness and the dose are within the predefined percentage of their respective threshold levels, then the wafer is passed to downstream processing (block 816).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer program product including program instructions stored on a computer readable storage medium, wherein the computer readable storage medium is not a transitory signal per se, the program instructions executable by a computing device in communication with an X-ray photoelectron spectroscopy (XPS) apparatus such that the program instructions cause the computing device to perform a method comprising:
   irradiating with the XPS apparatus a pad region of a semiconductor device and a feature region of the semiconductor device, the feature region including a feature of the semiconductor device, both the pad region and the feature region including a respective portion of a layer of interest of a material of the semiconductor device;
   recording with the XPS apparatus a pad response to radiation interacting with the pad region of the semiconductor device;
   recording with the XPS apparatus a feature response to radiation interacting with the feature region of the semiconductor device; and
   determining a characteristic of the layer of interest in the feature region based on a relationship between the pad response and the feature response.

2. The computer program product of claim 1, wherein the relationship between the pad response and the feature response includes consideration of an electron attenuation length (EAL) of at least one material included in the irradiated regions of the semiconductor device.

3. The computer program product of claim 2, wherein the characteristic determined is a thickness of the layer of interest.

4. The computer program product of claim 3, wherein the irradiating of the pad region and the feature region includes reflecting an X-ray beam onto the pad region and the feature region, the recording the pad response and the feature response includes recording respective intensities of photoelectrons emitted thereby responsive to the reflecting of the X-ray beam, and the thickness of the layer of interest over the feature $T_F$ is determined based at least in part on the relationship:

$$T_F = L * \ln\left[k_{Di}\left(\frac{I_{DiF}}{I_{SubPad}}\right) + 1 - k_{Di} \cdot P\right],$$

where L is the EAL for the layer of interest, $k_{Di}$ is a constant representing photoelectron intensities that would result from irradiating substrate and dielectric layers of infinite thickness, $I_{DiF}$ is a measured feature intensity of photoelectrons emitted by the layer of interest over the feature, $I_{SubPad}$ is a measured pad intensity of photoelectrons emitted by the substrate in the pad region, and P is a plasmon correction constant.

5. The computer program product of claim 3, wherein the layer of interest includes an oxide of silicon (SiO) and the relationship is further based at least in part on an EAL of SiO.

6. The computer program product of claim 3, wherein the substrate includes silicon (Si) and the feature includes a fin of a finFET formed in the substrate and coated with the layer of interest.

7. The computer program product of claim 1, wherein the semiconductor device includes a substrate in which the feature is formed, the substrate and feature supporting respective portions of the layer of interest including an atomic species not included in the substrate, the relationship between pad response and feature response is based at least in part on an atomic density of the substrate, and the characteristic determined is an actual dose of the atomic species in the layer of interest.

8. The computer program product of claim 7, wherein the irradiating of the pad region and the feature region includes reflecting an X-ray beam onto the pad region and the feature region, the recording the pad response and the feature response includes recording respective intensities of photoelectrons emitted thereby responsive to the reflecting of the X-ray beam, and the actual atomic species dose $Dose_F$ in the layer of interest over the feature is determined at least in part by the relationship:

$$Dose_F = \rho_{Sub}\left[\frac{\left(\frac{I_{DopF}}{R_{Dop}}\right)}{\left(\frac{I_{DiPad}}{R_{Di}}\right)}\right] * T_F$$

where $\rho_{sub}$ is the atomic density of the substrate, $I_{DopF}$ is the intensity of photoelectrons emitted by the dopant in the layer of interest over the feature, $I_{DiF}$ is the intensity of photoelectrons emitted by the layer of interest over the feature, $R_{Dop}$ is a relative sensitivity factor for the atomic species, $R_{Di}$ is a relative sensitivity factor for the layer of interest, and $T_F$ is the thickness of the layer of interest over the pad region.

9. The computer program product of claim 8, wherein the substrate includes a semiconductor, the layer of interest includes at least one of a metallic and a dielectric material, and the atomic species includes a dopant.

10. A process including:
forming a feature in a semiconductor substrate, thereby forming a feature region including the feature and a pad region including substantially unmodified substrate material;
applying a material to form a layer of interest over the feature region and the pad region so that each of the feature region and the pad region include a respective portion of the layer of interest;
irradiating the pad region with X-rays and recording resulting photoelectron intensities and respective locations thereof from the pad region;
irradiating the feature region with X-rays and recording resulting photoelectron intensities and respective locations thereof from the feature region;
identifying peak photoelectron intensities from each of the pad region and the feature region;
determining respective photoelectron species for each peak intensity based at least in part on a location of the respective peak with respect to the feature region; and
determining a characteristic of the layer of interest based at least in part on a relationship between at least two of the photoelectron intensity peaks.

11. The method of claim 10, wherein the relationship between the at least two of the photoelectron intensity peaks includes consideration of an electron attenuation length (EAL) of at least one material included in the pad region and the feature region of the semiconductor device.

12. The process of claim 11, wherein the characteristic of the layer of interest is a thickness of the layer of interest.

13. The method of claim 12, wherein the thickness of the layer of interest over the feature $T_F$ is determined based at least in part on the relationship:

$$T_F = L * \ln\left[k_{Di}\left(\frac{I_{DiF}}{I_{SubPad}}\right) + 1 - k_{Di} \cdot P\right],$$

where L is the EAL for the dielectric layer, $k_{Di}$ is a constant representing photoelectron intensities that would result from irradiating a substrate layer and layer of interest of infinite thickness, $I_{DiF}$ is a measured feature intensity of photoelectrons emitted by the layer of interest over the feature, $I_{SubPad}$ is a measured pad intensity of photoelectrons emitted by the substrate in the pad region, and P is a plasmon correction constant.

14. The method of claim 12, wherein the layer of interest includes a dielectric material and the relationship is further based at least in part on an EAL of the dielectric material.

15. The method of claim 12, wherein the substrate includes a semiconductor and the feature includes a fin of a finFET formed in the substrate and coated with the layer of interest.

16. The method of claim 10, further comprising including in the layer of interest an atomic species distinct from any in the substrate, wherein the relationship between the at least two photoelectron intensity peaks is based at least in part on an atomic density of the substrate, and the characteristic determined is an actual dose of the atomic species in the layer of interest.

17. The method of claim 16, wherein the actual dose of the atomic species $Dose_F$ in the layer of interest over the feature is determined at least in part by the relationship:

$$\text{Dose}_F = \rho_{Sub}\left[\frac{\left(\frac{I_{DopF}}{R_{Dop}}\right)}{\left(\frac{I_{DiPad}}{R_{Di}}\right)}\right] * T_F$$

where $\rho_{sub}$ is the atomic density of the substrate, $I_{DopF}$ is the photoelectron peak intensity emitted by the dopant in the layer of interest over the feature, $I_{DiPad}$ is the photoelectron peak intensity emitted by the layer of interest in the blanket pad region, $R_{Dop}$ is a relative sensitivity factor for the atomic species, $R_{Di}$ is a relative sensitivity factor for the layer of interest in the blanket pad region, and $T_F$ is the thickness of the layer of interest over the blanket pad region.

18. The method of claim 17, wherein the substrate includes a semiconductor, the layer of interest includes at least one of a dielectric and a semiconductor material, the atomic species includes at least one of a dopant and an impurity, and the feature includes a fin of a finFET.

19. A system comprising:
at least one computing device in communication with an X-ray photoelectron spectroscopy (XPS) apparatus including a target stage and an X-ray beam generator, the at least one computing device including at least one non-transitory computer readable storage medium on which is stored instructions in the form of computer executable code that when executed by the at least one computing device cause the at least one computing device to:
instruct the XPS apparatus to irradiate a semiconductor device including a substrate layer and a layer of interest over a pad region and a feature region, the feature region including at least one feature of the semiconductor device;
instruct the XPS apparatus to record intensities of photoelectrons emitted from the pad region and respective locations from which the photoelectrons are emitted;
instruct the XPS apparatus to record intensities of photoelectrons emitted from the feature region and respective locations from which the photoelectrons are emitted;
identify peak photoelectron intensities and respective locations from which the peak photoelectron intensities were emitted; and
determine a thickness $T_F$ of the layer of interest over the feature based at least in part on the relationship:

$$T_F = L * \ln\left[k_{Di}\left(\frac{I_{DiF}}{I_{SubPad}}\right) + 1 - k_{Di} \cdot P\right],$$

where L is the EAL for the layer of interest, $k_{Di}$ is a constant representing photoelectron intensities that would result from irradiating substrate and layer of interest of infinite thickness, $I_{DiF}$ is a measured feature intensity of photoelectrons emitted by the layer of interest over the feature, $I_{SubPad}$ is a measured pad intensity of photoelectrons emitted by the substrate in the pad region, and P is a plasmon correction constant.

20. The system of claim 19, wherein the layer of interest includes an atomic species distinct from any in the substrate and the instructions further cause the computing device to determine an actual atomic species dose $\text{Dose}_F$ of the layer of interest over the feature based at least in part on the relationship:

$$\text{Dose}_F = \rho_{-Sub}\left[\frac{\left(\frac{I_{DopF}}{R_{Dop}}\right)}{\left(\frac{I_{DiPad}}{R_{Di}}\right)}\right] * T_F$$

where $\rho_{sub}$ is the atomic density of the substrate, $I_{DopF}$ is the photoelectron peak intensity emitted by the atomic species in the layer of interest over the feature, $I_{DiPad}$ is the photoelectron peak intensity emitted by the layer of interest over the blanket pad region, $R_{Dop}$ is a relative sensitivity factor for the atomic species, $R_{Di}$ is a relative sensitivity factor for the material of the layer of interest, and $T_F$ is the thickness of the layer of interest over the feature region.

* * * * *